(12) United States Patent
Muraki et al.

(10) Patent No.: US 6,784,442 B2
(45) Date of Patent: Aug. 31, 2004

(54) EXPOSURE APPARATUS, CONTROL METHOD THEREOF, AND DEVICE MANUFACTURING METHOD

(75) Inventors: Masato Muraki, Tokyo (JP); Hiroya Ohta, Kodaira (JP); Shin-ichi Hashimoto, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 102 days.

(21) Appl. No.: 10/329,388

(22) Filed: Dec. 27, 2002

(65) Prior Publication Data

US 2003/0122087 A1 Jul. 3, 2003

(30) Foreign Application Priority Data

Dec. 28, 2001 (JP) .................................... 2001-401639

(51) Int. Cl.[7] .................................................. G21G 5/00
(52) U.S. Cl. ............................ 250/492.2; 250/396 R; 250/596 ML; 250/398
(58) Field of Search ...................... 250/396 R, 396 ML, 250/492.2, 398

(56) References Cited

U.S. PATENT DOCUMENTS 5,363,021 A * 11/1994 MacDonald ................ 315/366
5,834,783 A    11/1998 Muraki et al. .............. 250/398
5,973,332 A    10/1999 Muraki et al. ............ 250/492.2
6,274,877 B1   8/2001 Muraki ................... 250/492.23
6,483,120 B1   11/2002 Yui et al. ................. 250/491.1
6,498,348 B2 * 12/2002 Aitken ................. 250/396 ML
2001/0004185 A1   6/2001 Muraki et al. ............ 313/359.1
2002/0008207 A1   1/2002 Muraki et al. .............. 250/398

OTHER PUBLICATIONS

T. Haraguchi et al., Advantest Lab., "Development of Electromagnetic Lens for Multi–EB Lithography System", the 62nd Annual Meeting of the Japan Society of Applied Physics, (Lecture No. 11a–C–5), p. 544, Sep.2001.

* cited by examiner

Primary Examiner—John R. Lee
Assistant Examiner—Erin-Michael Gill
(74) Attorney, Agent, or Firm—Fitzpatrick, Cella, Harper & Scinto

(57) ABSTRACT

This invention provides a multi-charged-particle beam exposure apparatus capable of easily correcting at a high precision the electron-optic characteristics of each column which constitutes an electron-optic system. The exposure apparatus has magnetic lens arrays (ML1, ML2, ML3, and ML4) which commonly adjust the electron-optic characteristics of a plurality of columns which constitute the electron-optic system, and dynamic focus lenses or deflector arrays which individually correct the electron-optic characteristics of the columns.

10 Claims, 12 Drawing Sheets

INTERMEDIATE IMAGE
OF ELECTRON SOURCE

EXPOSURE APPARATUS, CONTROL METHOD THEREOF, AND DEVICE MANUFACTURING METHOD

FIELD OF THE INVENTION

The present invention relates to a drawing apparatus which draws a pattern on a substrate with a plurality of charged-particle beams, a control method thereof, and a device manufacturing method.

BACKGROUND OF THE INVENTION

An example of a multi-charged-particle beam exposure apparatus using a plurality of charged-particle beams is an electron beam exposure apparatus proposed in the 62nd Annual Meeting of the Japan Society of Applied Physics (lecture: No. 11a-C-5). FIGS. 11A and 11B are schematic views showing this electron beam exposure apparatus. In FIGS. 11A and 11B, a plurality of electron beams from a plurality of electron sources ES which emit electrons irradiate a wafer W serving as a surface to be exposed via magnetic lenses ML of a magnetic lens array MLA. The magnetic lens array MLA is constituted by vertically arranging, at an interval, magnetic disks MD having a plurality of openings of the same shape. The magnetic disks MD are excited by a common coil CC. Each opening functions as the magnetic pole of each magnetic lens ML, and generates the same lens magnetic field in design.

The exposure apparatus has the following features. (1) A plurality of electron beams enter the wafer W without crossing each other, the Coulomb effect between a plurality of electron beams can be ignored, and the wafer can be irradiated with an electron beam of a large current. (2) The coil as an excitation means is shared by a plurality of magnetic poles, and arranged outside the plurality of magnetic poles. This allows arraying a plurality of magnetic lenses close to each other, and arranging a plurality of electron beams at a high density.

With these two features, a higher throughput of the exposure apparatus is expected.

Owing to nonuniformity in the permeability and opening shape of the magnetic disk, electron-optic characteristics change between a plurality of magnetic lenses which constitute the magnetic lens array. To correct this difference, each magnetic lens array must be equipped with an electron-optic element serving as an adjuster which adjusts electron-optic characteristics. However, a plurality of magnetic lenses are arranged close to each other, and the adjustment amount is restricted due to downsizing of the adjustment electron-optic element and reduction in the interference between electron-optic elements. It is difficult to adjust all the optical characteristics of a plurality of magnetic lenses to a target value.

SUMMARY OF THE INVENTION

The present invention has been made in consideration of the above situation, and has as its object to accurately correct, e.g., the electron-optic characteristics of a plurality of magnetic lenses which constitute a magnetic lens array.

According to the first aspect of the present invention, there is provided an exposure apparatus which draws a pattern on a substrate with a plurality of charged-particle beams, comprising a charged-particle beam generation source which generates a plurality of charged-particle beams grouped into a plurality of groups each formed from at least one charged-particle beam, a magnetic lens array which is constituted by arraying a plurality of magnetic lenses corresponding to the plurality of groups between the charged-particle beam generation source and a substrate stage which supports the substrate, the plurality of magnetic lenses being excited by a common excitation unit, a plurality of electron-optic elements which are arranged in correspondence with the plurality of groups and individually correct electron-optic characteristics of the plurality of magnetic lenses, and a control system which controls the common excitation unit to adjust the electron-optic characteristics of the plurality of magnetic lenses at once, and individually controls the plurality of electron-optic elements to individually correct the electron-optic characteristics of the plurality of magnetic lenses, thereby optimizing an image formed on the substrate with the plurality of charged-particle beams grouped into the plurality of groups.

According to a preferred aspect of the present invention, the control system preferably controls the common excitation unit so as to minimize a maximum value of differences between the electron-optic characteristics of the plurality of magnetic lenses and a target characteristic.

According to another preferred aspect of the present invention, the control system preferably controls the common excitation unit and the plurality of electron-optic elements so as to make a focal position of each of the plurality of magnetic lenses coincide with a target position.

According to still another preferred aspect of the present invention, each group may be formed from a plural charged-particle beams. The control system preferably controls the common excitation unit and the plurality of electron-optic elements every group so as to correct at least one of magnification and rotation of images each of which is formed on the substrate with the plural charged-particle beams of one group. This is realized when, for example, each electron-optic element has a plurality of deflectors which deflect a plurality of charged-particle beams passing through the electron-optic element, and the control system individually controls the plurality of deflectors arranged for the electron-optic element. Alternatively, each electron-optic element may have a plurality of incident position changing elements which change incident positions of a plurality of charged-particle beams passing through the electron-optic element on corresponding magnetic lenses, and the control system may individually control the plurality of incident position changing elements arranged for the electron-optic element, thereby correcting at least one of magnification and rotation of the image formed on the substrate.

The second aspect of the present invention relates to a method of controlling an exposure apparatus which draws a pattern on a substrate with a plurality of charged-particle beams. The exposure apparatus includes a charged-particle beam generation source which generates a plurality of charged-particle beams grouped into a plurality of groups each formed from at least one charged-particle beam, a magnetic lens array which is constituted by arraying a plurality of magnetic lenses corresponding to the plurality of groups between the charged-particle beam generation source and a substrate stage which supports the substrate, the plurality of magnetic lenses being excited by a common excitation unit, and a plurality of electron-optic elements which are arranged in correspondence with the plurality of groups and individually correct electron-optic characteristics of the plurality of magnetic lenses. The control method comprises the first step of adjusting the electron-optic characteristics of the plurality of magnetic lenses at once by controlling the common excitation unit, and the second step of individually correcting the electron-optic characteristics of the plurality of magnetic lenses by individually controlling the plurality of electron-optic elements. An image formed on the substrate with the plurality of charged-particle beams grouped into the plurality of groups is optimized by the first and second steps.

According to the third aspect of the present invention, there is provided a manufacturing method of manufacturing a device through a lithography step, wherein the lithography step includes the step of drawing a pattern on a substrate using the above exposure apparatus.

According to the fourth aspect of the present invention, there is provided a manufacturing method of manufacturing a device through a lithography step, wherein the lithography step includes the step of drawing a pattern on a substrate using an exposure apparatus controlled by the above control method.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

An electron beam exposure apparatus according to a preferred embodiment of the present invention will be described below with reference to the accompanying drawings. The electron beam exposure apparatus is merely an application of the present invention, and the present invention can be applied to an exposure apparatus using a charged-particle beam such as an ion beam other than an electron beam.

(Description of Building Component of Electron Beam Exposure Apparatus)

Figure 1A:
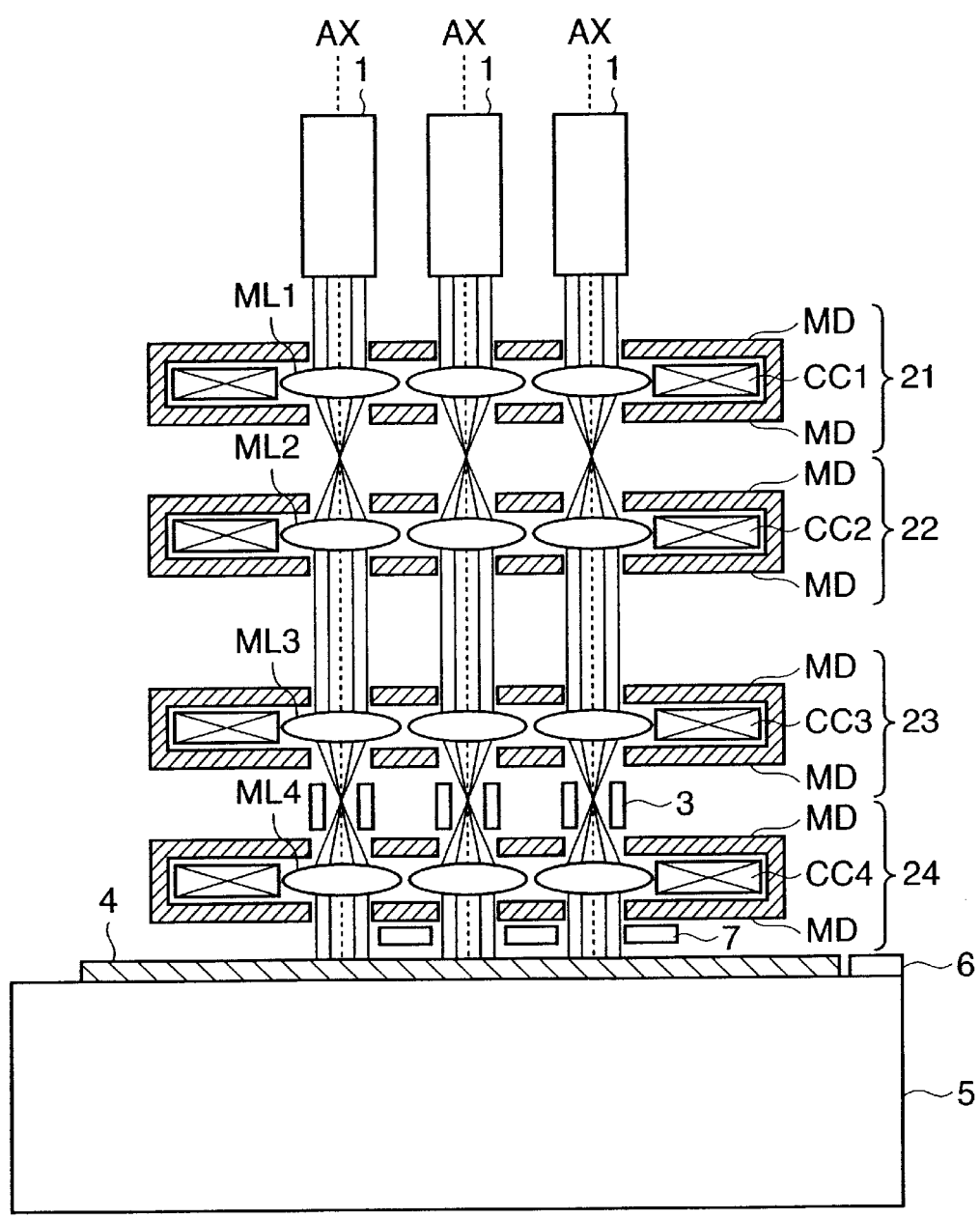
FIG. 1A is a sectional view schematically showing the main part of an electron beam exposure apparatus according to a preferred embodiment of the present invention.
Figure 1B:
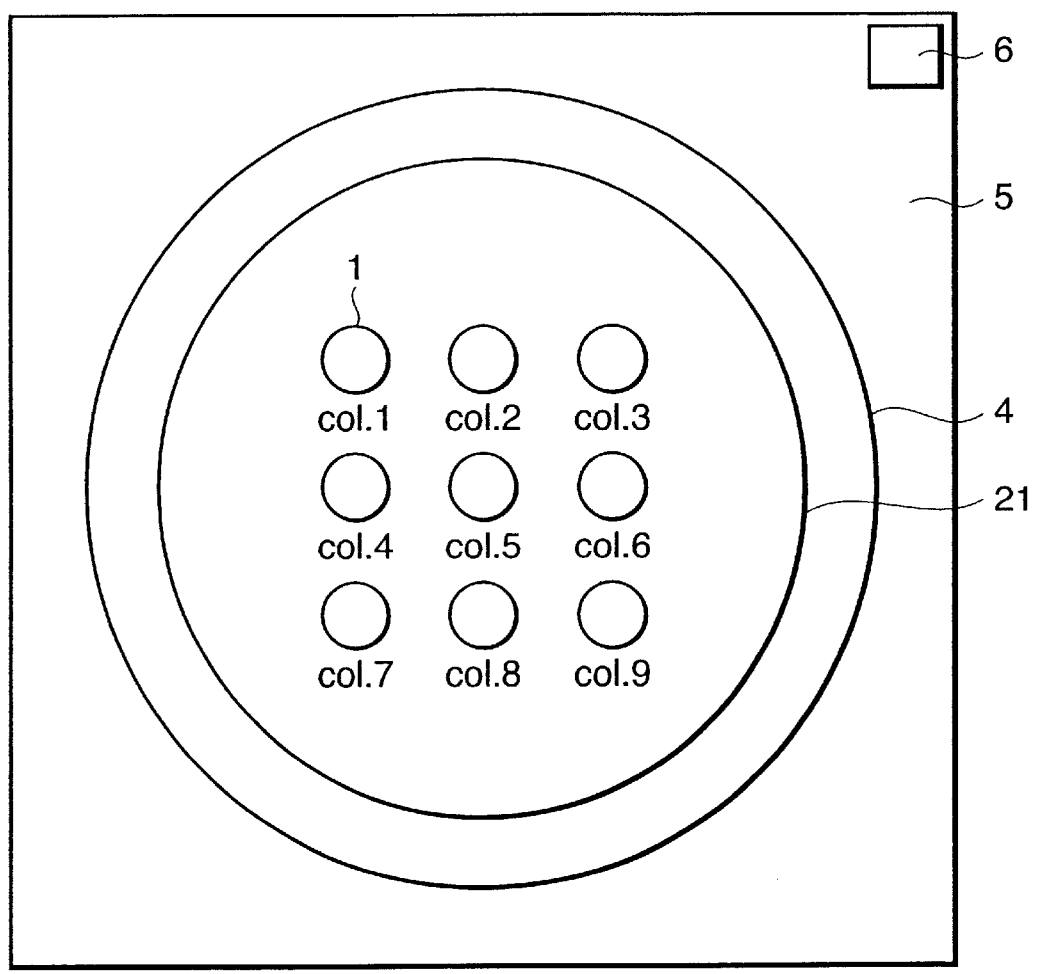
FIG. 1B is a plan view showing the electron beam exposure apparatus in FIG. 1A when viewed from above.

FIG. 1A is a sectional view schematically showing the main part of the electron beam exposure apparatus according to the preferred embodiment of the present invention. FIG. 1B is a plan view showing the electron beam exposure apparatus in FIG. 1A when viewed from above. FIG. 1A illustrates the sections of magnetic lens arrays 21, 22, 23, and 24.

The exposure apparatus comprises a plurality of multi-source modules 1 serving as an electron beam source which emits an electron beam. Each multi-source module 1 forms a plurality of electron source images, and emits a plurality of electron beams corresponding to the respective electron source images. The multi-source modules 1 are arrayed in a 3×3 matrix in this embodiment. The multi-source modules 1 will be described in detail below.

The magnetic lens arrays 21, 22, 23, and 24 are interposed between the plurality of multi-source modules 1 and a stage 5. Each magnetic lens array is constituted by vertically arranging, at an interval, two magnetic disks MD having openings of the same shape which are arrayed in a 3×3 matrix in correspondence with the array of the multi-source modules 1. The magnetic disks MD of the magnetic lens arrays 21, 22, 23, and 24 are excited by common coils CC1, CC2, CC3, and CC4. Each opening functions as the magnetic pole of each magnetic lens ML, and generates the same lens magnetic field in design. A plurality of electron source images formed by each multi-source module 1 are projected on a wafer 4 held on the stage 5 via corresponding four magnetic lenses (ML1, ML2, ML3, and ML4) of the magnetic lens arrays 21, 22, 23, and 24. An electron-optic system which causes a field such as a magnetic field to act on an electron beam until the electron beam emitted by one multi-source module 1 irradiates the wafer is defined as a column. The exposure apparatus of this embodiment has nine columns (col.1 to col.9).

The intermediate image of the electron source in the multi-source module 1 is formed by the magnetic lens of the magnetic lens array 21 and a corresponding magnetic lens of the magnetic lens array 22. Another intermediate image of the electron source is formed on the wafer 4 by the magnetic lens of the magnetic lens array 23 and a corresponding magnetic lens of the magnetic lens array 24. That is, the image of the electron source in the multi-source module 1 is projected on the wafer 4. By individually controlling the excitation conditions of the magnetic lens arrays 21, 22, 23, and 24 by the coils CC1, CC2, CC3, and CC4, the optical characteristics (focal position, image rotation, and magnification) of the columns can be adjusted almost uniformly (i.e., by the same amount).

Each column has a main deflector 3. The main deflector 3 deflects a plurality of electron beams from a corresponding multi-source module 1, and displaces a plurality of electron source images in the X and Y directions on the wafer 4.

The stage 5 can move the wafer 4 set on it in the X and Y directions perpendicular to an optical axis AX (Z-axis) and the rotation direction around the Z-axis. A stage reference plate 6 is fixed to the stage 5.

A reflected-electron detector 7 detects reflected electrons generated when a mark on the stage reference plate 6 is irradiated with an electron beam.

Figure 2:
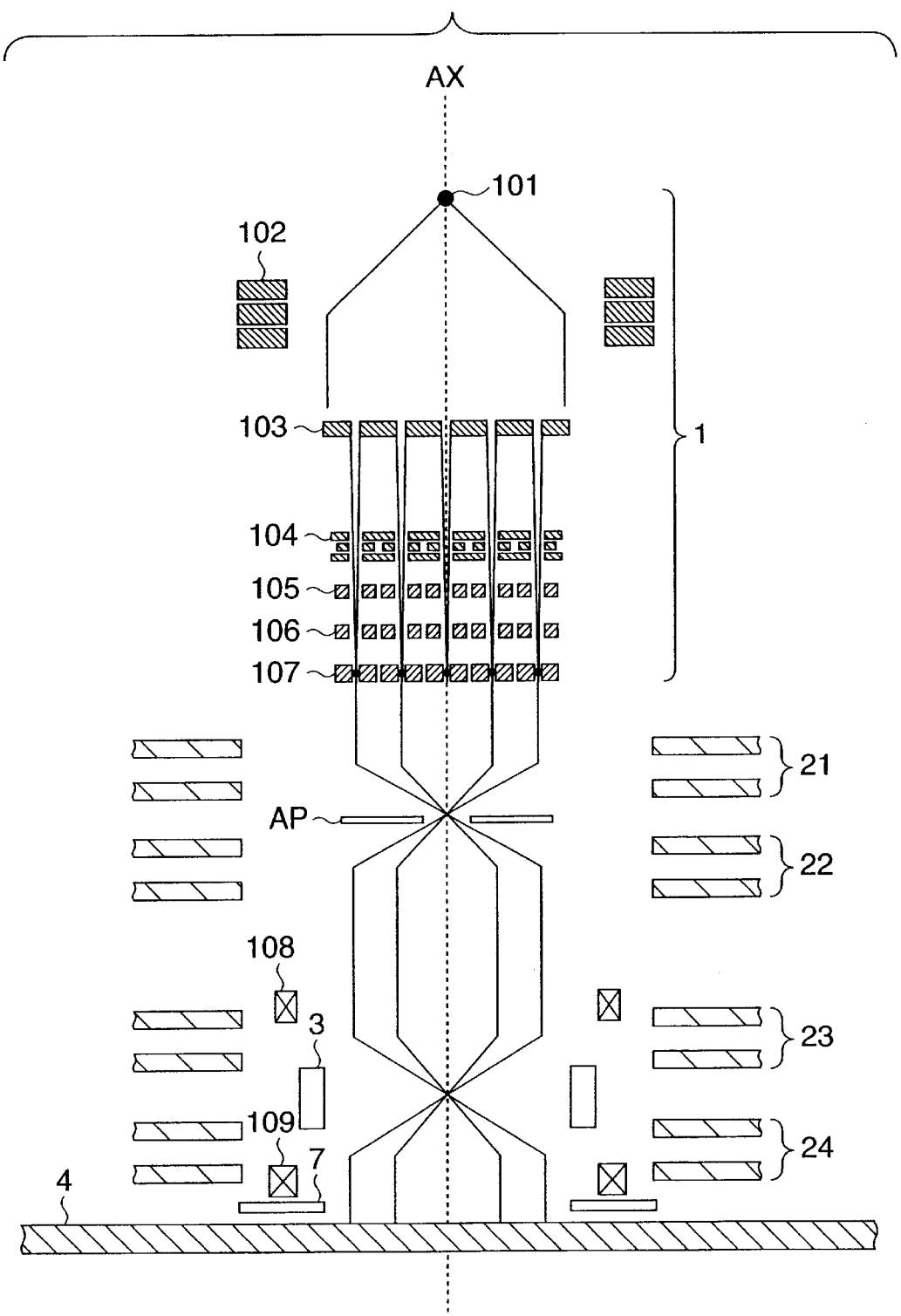
FIG. 2 is a sectional view showing one column in FIG. 1A in detail.

FIG. 2 is a sectional view showing one column in FIG. 1A in detail. The detailed arrangements of the multi-source module 1 and column will be explained with reference to FIG. 2.

The multi-source module 1 has an electron gun (not shown) which forms an electron source (crossover image) 101. The flow of electrons radiated by the electron source 101 is changed into an almost collimated electron beam by a condenser lens 102. The condenser lens 102 of this embodiment is an electrostatic lens made up of three aperture electrodes.

One almost collimated electron beam formed through the condenser lens 102 enters an aperture array 103 formed by two-dimensionally arraying a plurality of apertures. The electron beam passes through the plurality of apertures. A plurality of electron beams having passed through the aperture array 103 pass through a lens array 104 formed by two-dimensionally arraying electrostatic lenses having the same optical power. The electron beams pass through deflector arrays 105 and 106 each formed by two-dimensionally arraying individually drivable electrostatic octupole deflectors. The electron beams further pass through a blanker array 107 formed by two-dimensionally arraying individually drivable electrostatic blankers.

Figure 3:
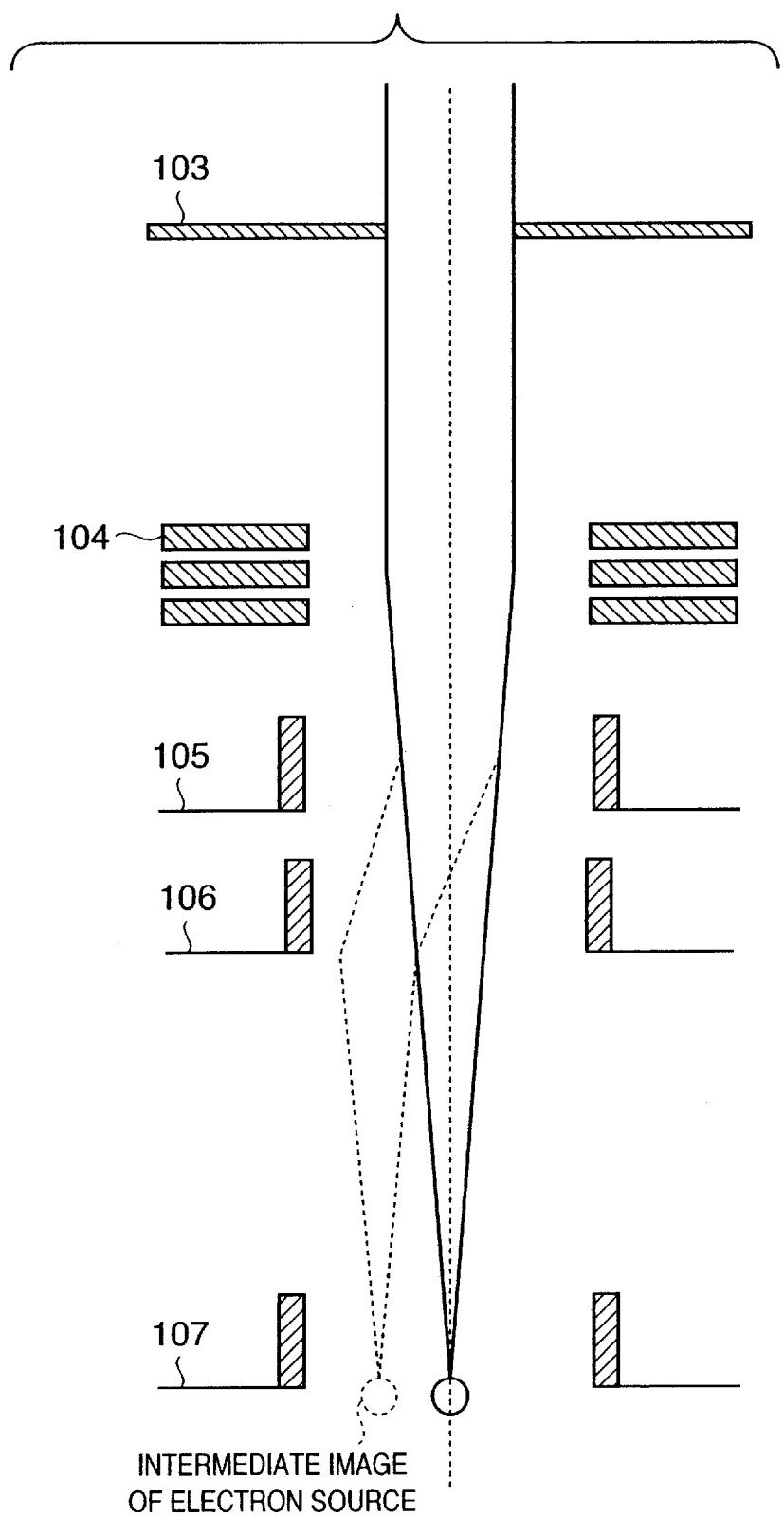
FIG. 3 is an enlarged view showing part of a multi-source module 1.

FIG. 3 is an enlarged view showing part of the multi-source module 1. The function of each portion of the multi-source module 1 will be explained with reference to FIG. 3. An almost collimated electron beam formed by the condenser lens 102 is split into a plurality of electron beams by the aperture array 103 having a plurality of apertures. The split electron beams form the intermediate images of the electron source on corresponding blankers (more accurately, between blanker electrodes) of the blanker array 107 via the electrostatic lenses of a corresponding lens array 104.

The deflectors of the deflector arrays 105 and 106 have a function of individually adjusting the position (position within a plane perpendicular to the optical axis AX) of the intermediate image of the electron source formed at the position of a corresponding blanker on the blanker array 107.

An electron beam deflected by each blanker of the blanker array 107 is cut off by a blanking aperture AP in FIG. 2, and does not enter the wafer 4. An electron beam not deflected by the blanker array 107 is not cut off by the blanking aperture AP, and enters the wafer 4. In other words, a desired pattern can be drawn on the wafer 4 by individually controlling whether to allow a plurality of electron beams to enter the wafer 4 by a plurality of blankers of the blanker array 107 while a plurality of electron beams are deflected by the main deflector 3.

Referring back to FIG. 2, a plurality of intermediate images of the electron source formed by each multi-source module 1 are projected on the wafer 4 via corresponding four magnetic lenses (four magnetic lenses of the same column) of the magnetic lens arrays 21, 22, 23, and 24.

Of the optical characteristics of each column in projecting a plurality of intermediate images on the wafer 4, the image rotation and magnification can be individually corrected by the deflector arrays 105 and 106 each having a plurality of independent deflectors for separately adjusting the position of each intermediate image on the blanker array 107 (i.e., the incident position of an electron beam on the magnetic lens array). That is, the deflector arrays 105 and 106 function as an electron-optic element for individually correcting the rotation and magnification of an image projected on the wafer 4 every column. The focal position of each column can be individually adjusted by dynamic focus lenses (electrostatic or magnetic lenses) 108 and 109 arranged for each column. That is, the dynamic focus lenses 108 and 109 function as an electron-optic element for individually correcting the focal position every column.

Figure 4:
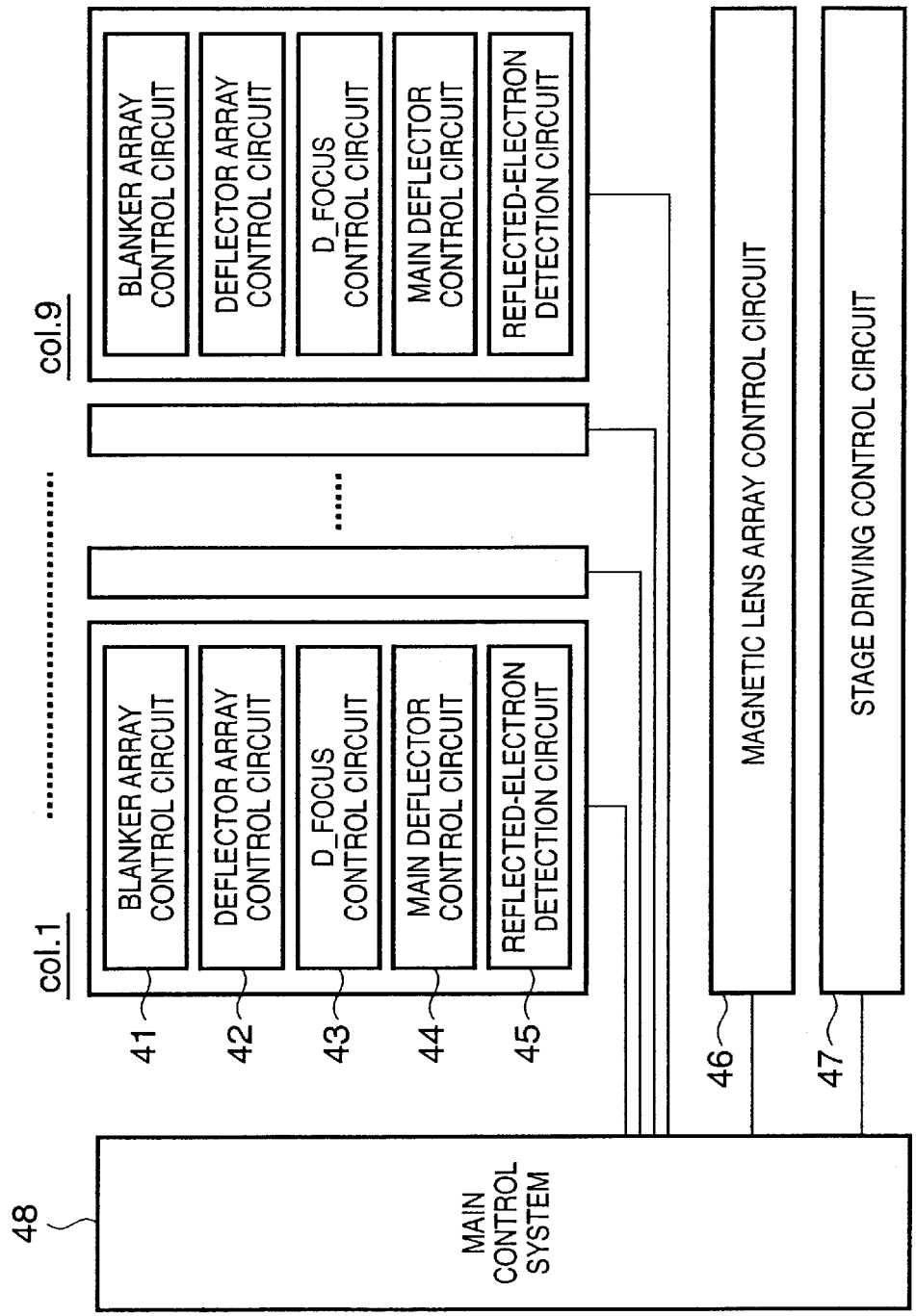
FIG. 4 is a block diagram for explaining the system configuration of the electron beam exposure apparatus according to the preferred embodiment of the present invention.

FIG. 4 is a block diagram showing the system configuration of the electron beam exposure apparatus.

Each blanker array control circuit 41 individually controls a plurality of blankers which constitute the blanker array 107. Each deflector array control circuit 42 individually controls a plurality of deflectors which constitute the deflector arrays 105 and 106. Each D_FOCUS control circuit 43 individually controls the dynamic focus lenses 108 and 109. Each main deflector control circuit 44 controls the main deflector 3. Each reflected-electron detection circuit 45 processes a signal from the reflected-electron detector 7. The blanker array control circuits 41, deflector array control circuits 42, D_FOCUS control circuits 43, main deflector control circuits 44, and reflected-electron detection circuits 45 are equipped by the same number as the columns (nine columns col.1 to col.9).

A magnetic lens array control circuit 46 controls the common coils CC1, CC2, CC3, and CC4 of the magnetic lens arrays 21, 22, 23, and 24. A stage driving control circuit 47 drives and controls the stage 5 in cooperation with a laser interferometer (not shown) which detects the position of the stage 5. A main control system 48 controls the above control circuits and manages the overall electron beam exposure apparatus.

(Description of Optical Characteristic Adjustment Method)

Figure 5:
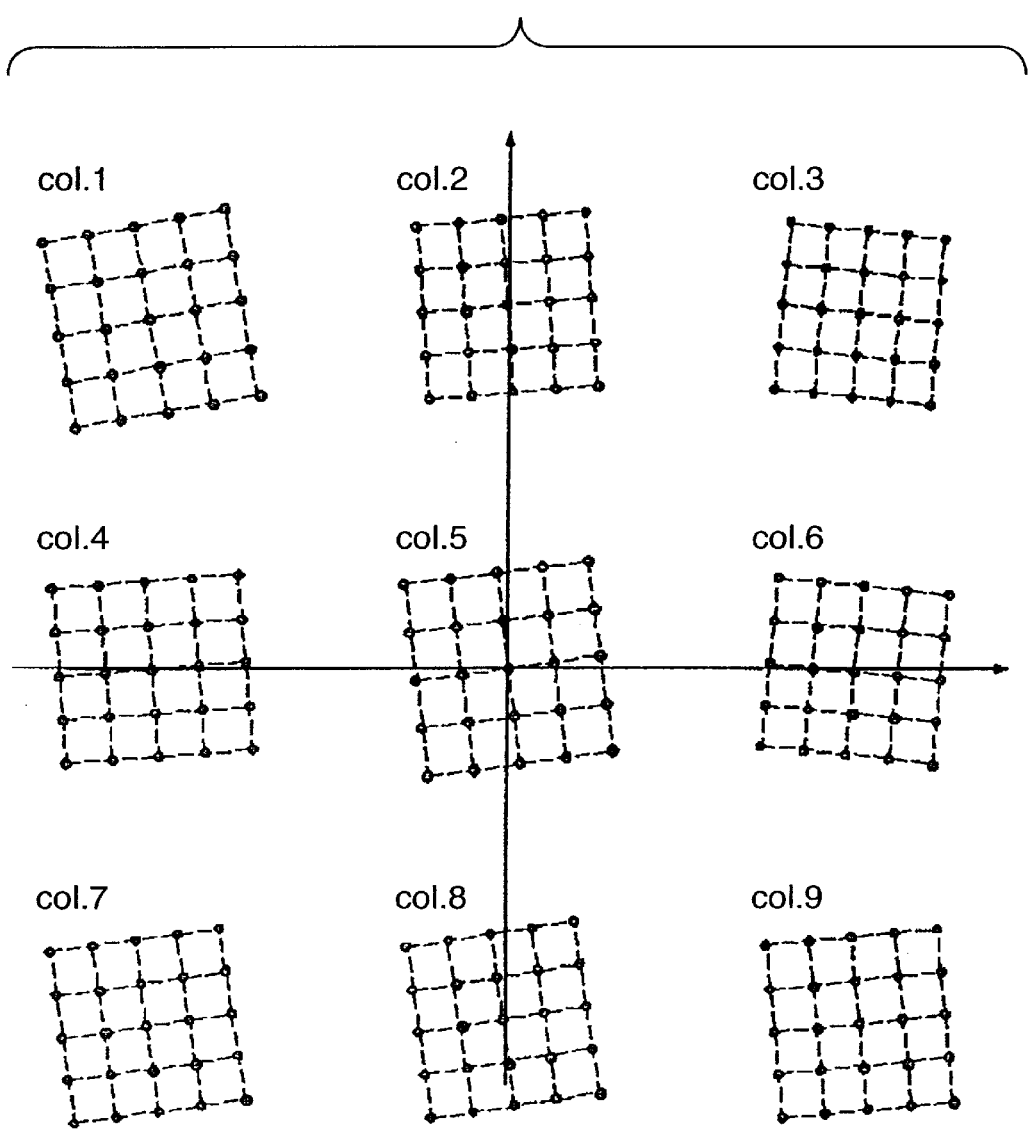
FIG. 5 is a view for explaining the electron-optic characteristics of a plurality of columns.

In the electron beam exposure apparatus of this embodiment, the electron-optic characteristics of a plurality of magnetic lenses which constitute the magnetic lens array are slightly different from each other owing to nonuniformity in the permeability and aperture shape of the magnetic disk. For example, different image rotations and magnifications of columns result in actual incident positions of electron beams on the wafer, as shown in FIG. 5 (incident positions are exaggerated in FIG. 5). In other words, the electron-optic characteristics (focal position, image rotation, magnification, and the like) change between columns.

As a method which solves this problem, an electron-optic characteristic adjustment method in the electron beam exposure apparatus according to the preferred embodiment of the present invention will be described.

Figure 6:
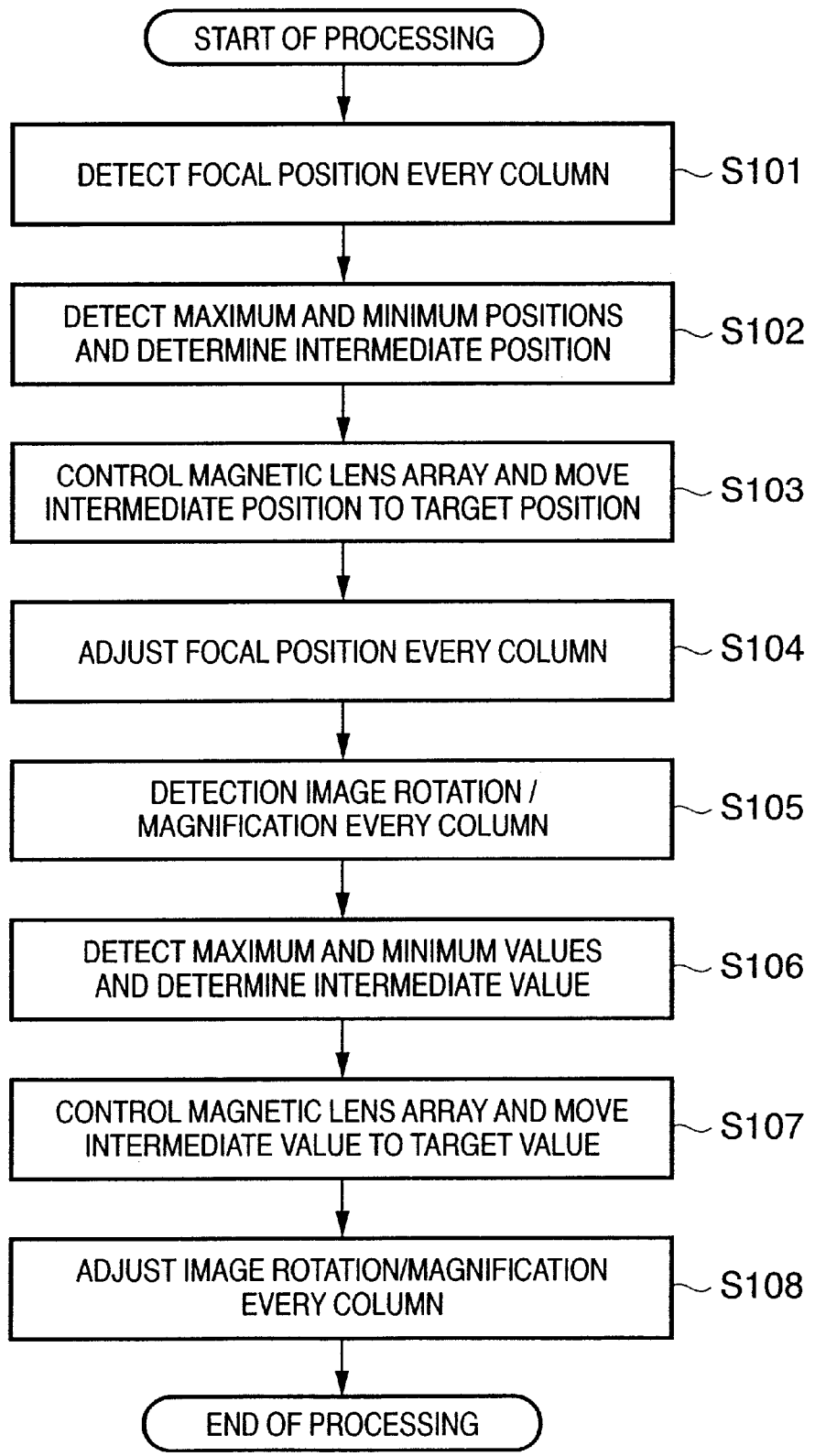
FIG. 6 is a flow chart for explaining electron-optic characteristic adjustment processing.

The main control system 48 executes electron-optic characteristic adjustment processing as shown in FIG. 6. The main control system 48 executes electron-optic characteristic adjustment processing in consideration of a change in the electron-optic characteristic of the column over time and a change in the target value of the electron-optic characteristic, e.g., every time the pattern to be drawn on the wafer is changed (i.e., every time the job is changed). The respective steps will be explained below.

In step S101, in order to detect the focal position of an electron beam on the wafer that represents each column (in this case, an electron beam at the center out of a plurality of electron beams of each column), the main control system 48 instructs the blanker array control circuit 41 to control the blanker array 107 which allows only an electron beam selected as a focal position detection target to enter the wafer 4.

At this time, the stage 5 is moved in advance by the stage driving control circuit 47 to locate the reference mark of the reference plate 6 near the irradiation position of the selected electron beam. The main control system 48 instructs the D_FOCUS control circuit 43 to oscillate the focal position of the electron beam by the dynamic focus lens 108 and/or 109. The main control system 48 instructs the main deflector control circuit 44 to scan the reference mark with the selected electron beam. The main control system 48 obtains, from the reflected-electron detection circuit 45, information about electrons reflected by the reference mark. As a result, the main control system 48 detects the current focal position of the electron beam. In step S101, this processing is executed for all electron beams which represent respective columns.

Figure 7A:
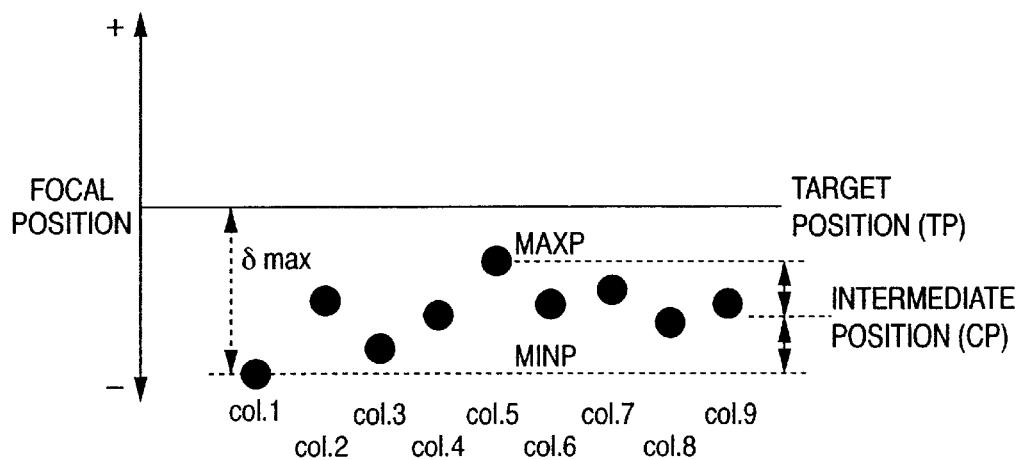
FIGS. 7A and 7B are graphs for explaining adjustment of the focal position by a magnetic lens array.

In step S102, as shown in FIG. 7A, the main control system 48 detects a maximum position (MAXP) and minimum position (MINP) from actual focal positions detected for electron beams which represent respective columns, and determines an intermediate position (CP).

Figure 7B:
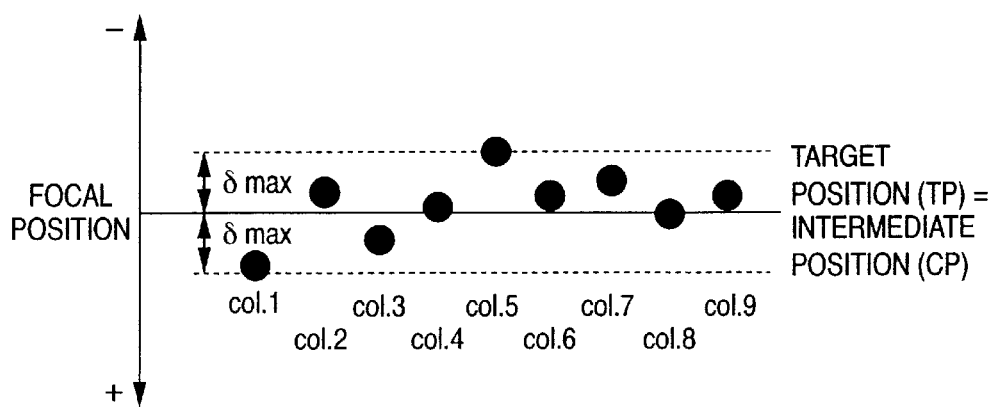

In step S103, the main control system 48 instructs the magnetic lens array control circuit 46 to adjust the common coils of the magnetic lens arrays 21, 22, 23, and 24 and move their focal positions by almost the same amount for all the columns so as to set the intermediate position (CP) to a target position (TP). The result is shown in FIG. 7B. More specifically, the maximum value ($\delta$max) of the difference between the target position and the actual focal position of each column is minimized. In the next step, the adjustment amount by the dynamic focus lenses 108 and 109 serving as focal position correction units arranged for each column can be minimized. This means that the plurality of focal position correction units 108 and 109 arranged for each column can be downsized and their interference can be minimized.

In step S104, the main control system 48 causes the dynamic focus lenses 108 and 109 to adjust the focal position so as to make the focal position coincide with the target position for each column on the basis of the difference between the target position and the actual focal position of each column as shown in FIG. 7B.

In step S105, the main control system 48 instructs the blanker array control circuit 41 to allow only the selected electron beam to enter the wafer in order to detect the incident position of each electron beam on the wafer. At this time, the stage 5 is moved in advance by the stage driving control circuit 47 to locate the reference mark of the reference plate 6 at the ideal irradiation position (design irradiation position) of the selected electron beam. The main control system 48 instructs the main deflector control circuit 44 to scan the reference mark with the selected electron beam. The main control system 48 obtains, from the reflected-electron detection circuit 45, information about electrons reflected by the reference mark. Hence, the main control system 48 can detect the current irradiation position of the electron beam. In step S105, this processing is executed for all electron beams. Based on the actual electron beam irradiation position for each column, the main control system 48 obtains the image rotation/magnification of the column.

Figure 8A:
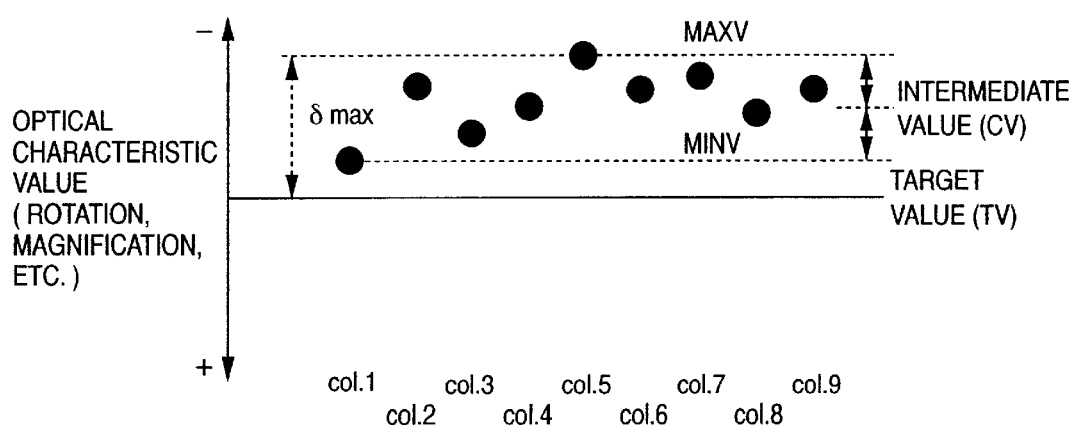
FIGS. 8A and 8B are graphs for explaining adjustment of the image rotation and magnification by the magnetic lens array.

In step S106, as shown in FIG. 8A, the main control system 48 detects a maximum value (MAXV) and minimum value (MINV) from image rotations/magnifications obtained for respective columns, and determines an intermediate value (CV).

Figure 8B:
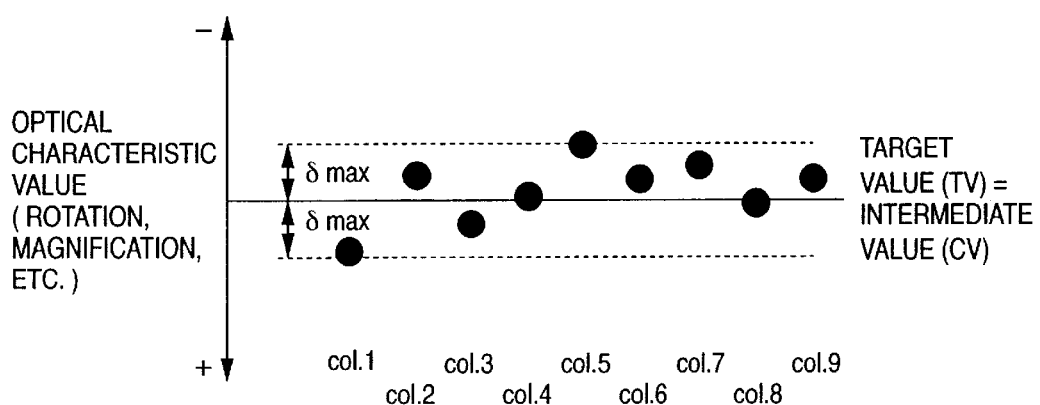

In step S107, the main control system 48 instructs the magnetic lens array control circuit 46 to adjust the common coils of the magnetic lens arrays 21, 22, 23, and 24 and move their image rotations/magnifications (without changing the focal positions) by almost the same amount for all the columns so as to set the intermediate value (CV) to a target value (TV). The result is shown in FIG. 8B. More specifically, the maximum value ($\delta$max) of the difference between the target value and the actual image rotation/magnification of each column is minimized. In the next step, the adjustment amount by the deflector arrays 105 and 106 serving as an image rotation/magnification correction unit arranged for each column can be minimized. This means that a plurality of deflectors which constitute each of the deflector arrays 105 and 106 serving as the image rotation/magnification correction unit arranged for each column can be downsized and the interference between the deflectors can be reduced.

In step S108, the main control system 48 causes the deflector arrays 105 and 106 serving as the image rotation/magnification correction unit to adjust the image rotation/magnification so as to make the image rotation/magnification coincide with the target value for each column on the basis of the difference between the target value and the actual image rotation/magnification of each column as shown in FIG. 8B. At this time, the image rotation/magnification is corrected by individually controlling a plurality of deflectors which constitute each of the deflector arrays 105 and 106.

(Device Manufacturing Method)

An embodiment of a device manufacturing method using the above-described electron beam exposure apparatus will be described.

Figure 9:
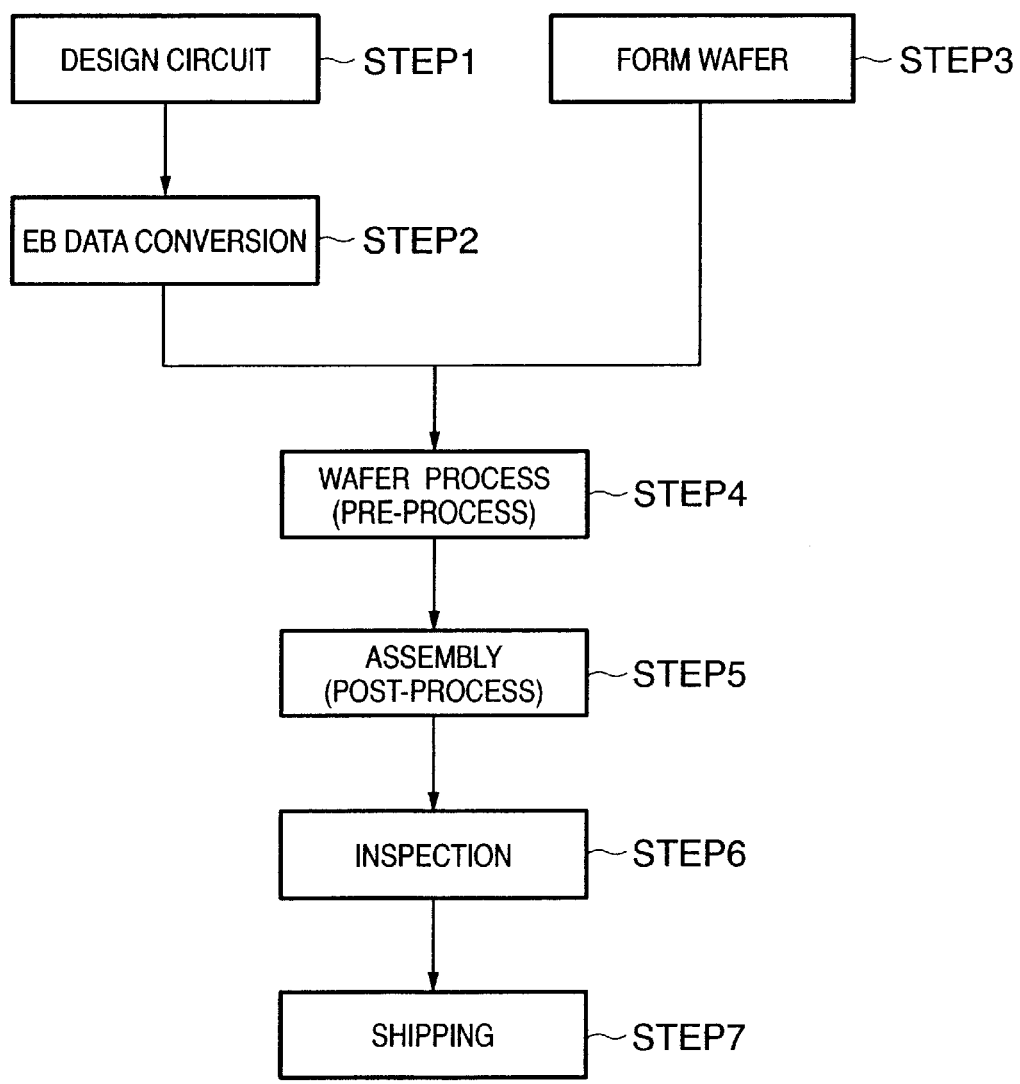
FIG. 9 is a flow chart for explaining the manufacturing flow of a microdevice.

FIG. 9 is a flow chart showing the manufacturing flow of a microdevice (semiconductor chip such as an IC or LSI, a liquid crystal panel, a CCD, a thin-film magnetic head, a micromachine, or the like). In step 1 (circuit design), a semiconductor device circuit is designed. In step 2 (exposure control data formation), exposure control data for the exposure apparatus is formed on the basis of a designed circuit pattern. In step 3 (wafer formation), a wafer is formed using a material such as silicon. In step 4 (wafer process) called a pre-process, an actual circuit is formed on the wafer by lithography using the wafer and the exposure apparatus to which the prepared exposure control data is input. Step 5 (assembly) called a post-process is the step of forming a semiconductor chip by using the wafer formed in step 4, and includes an assembly process (dicing and bonding) and packaging process (chip encapsulation). In step 6 (inspection), the semiconductor device manufactured in step 5 undergoes inspections such as an operation confirmation test and durability test. After these steps, the semiconductor device is completed and shipped (step 7).

Figure 10:
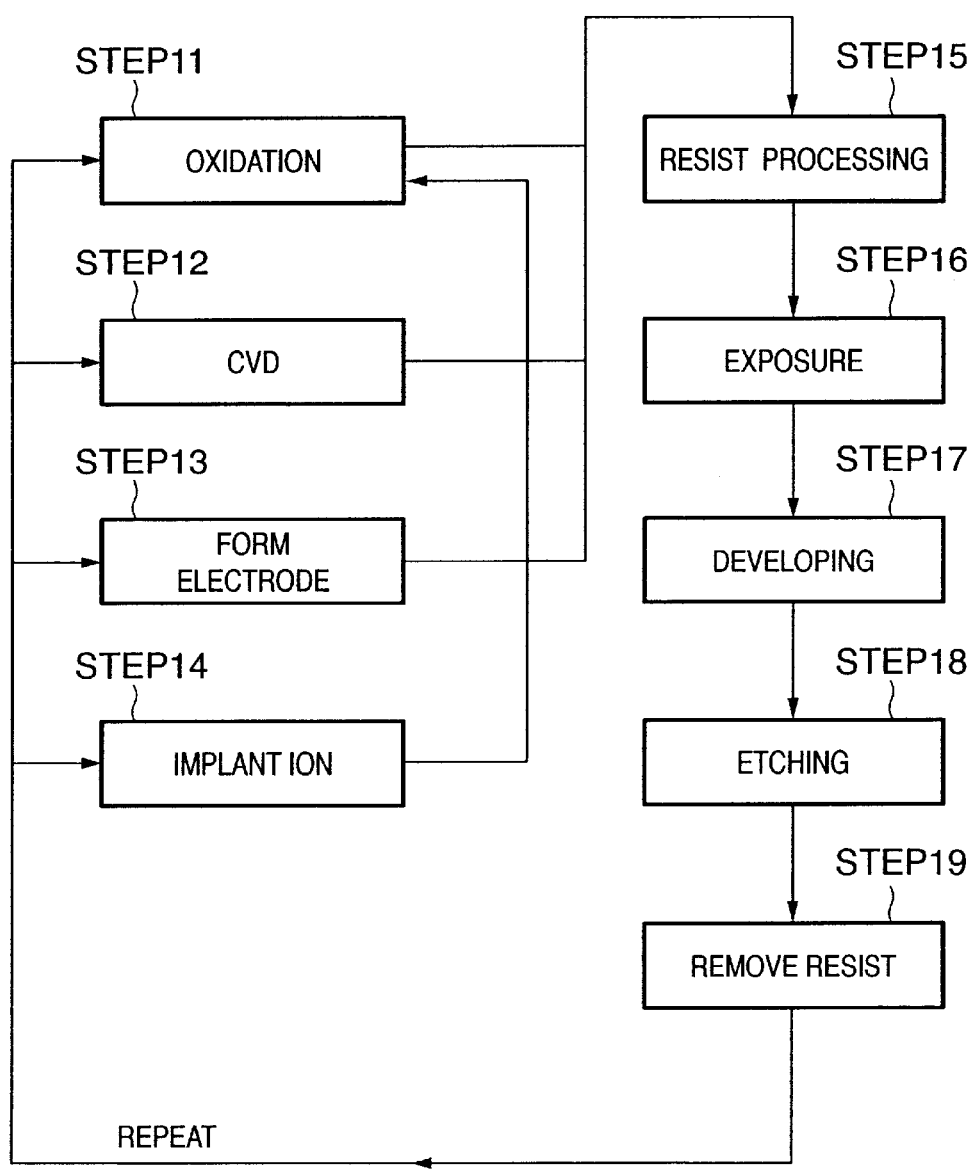
FIG. 10 is a flow chart for explaining the wafer process.
Figure 11A:
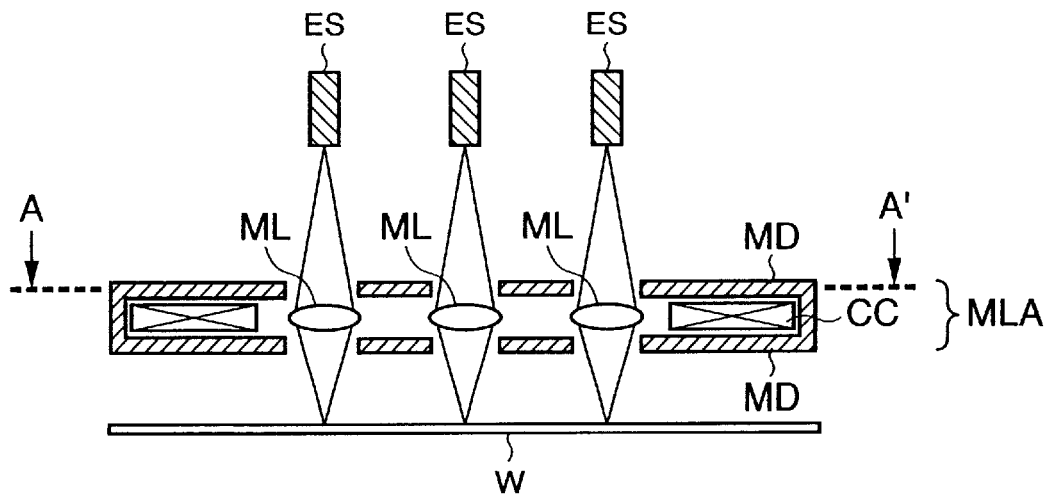
FIGS. 11A and 11B are a sectional view and plan view, respectively, for explaining a conventional multi-charged-particle beam exposure apparatus.
Figure 11B:
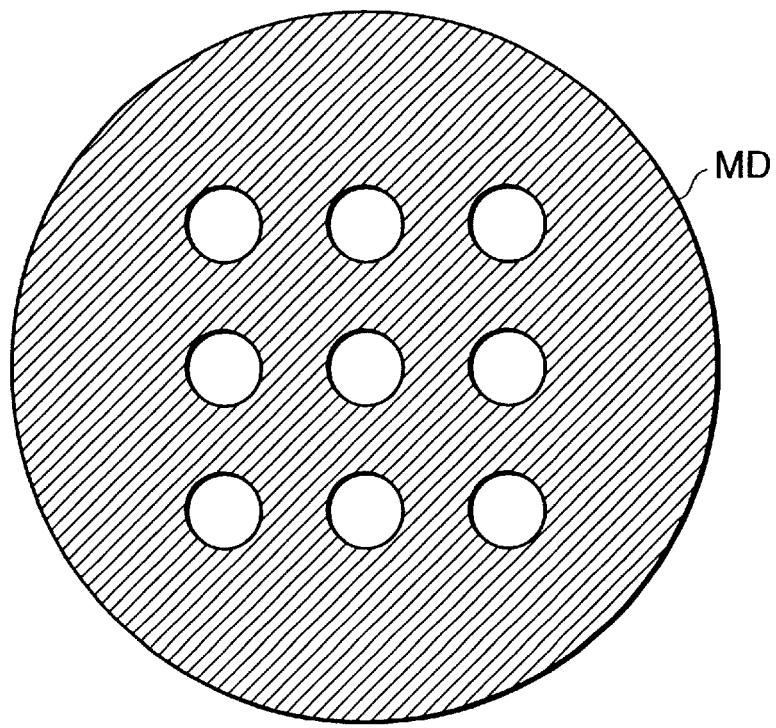

FIG. 10 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), a circuit pattern is drawn on the wafer by the above-mentioned exposure apparatus exposes. Prior to exposure processing, the exposure apparatus adjusts the focal position by the above method every column, and adjusts the image rotation and magnification every column. In step 17 (developing), the exposed wafer is developed. In step 18 (etching), the resist is etched except the developed resist image. In step 19 (resist removal), an unnecessary resist after etching is removed. These steps are repeated to form multiple circuit patterns on the wafer.

This manufacturing method enables manufacturing a highly integrated semiconductor device at low cost, which has conventionally been difficult to manufacture.

The present invention can accurately correct the electron-optic characteristics of a plurality of magnetic lenses which constitute a magnetic lens array.

As many apparently widely different embodiments of the present invention can be made without departing from the spirit and scope thereof, it is to be understood that the invention is not limited to the specific embodiments thereof except as defined in the claims.

What is claimed is:

1. An exposure apparatus which draws a pattern on a substrate with a plurality of charged-particle beams, comprising:

a charged-particle beam generation source which generates a plurality of charged-particle beams grouped into a plurality of groups each formed from at least one charged-particle beam;

a magnetic lens array which is constituted by arraying a plurality of magnetic lenses corresponding to the plurality of groups between said charged-particle beam generation source and a substrate stage which supports the substrate, the plurality of magnetic lenses being excited by a common excitation unit;

a plurality of electron-optic elements which are arranged in correspondence with the plurality of groups and individually correct electron-optic characteristics of the plurality of magnetic lenses; and a control system which controls the common excitation unit to adjust the electron-optic characteristics of the plurality of magnetic lenses at once, and individually controls said plurality of electron-optic elements to individually correct the electron-optic characteristics of the plurality of magnetic lenses, thereby optimizing an image formed on the substrate with the plurality of charged-particle beams grouped into the plurality of groups.

2. The apparatus according to claim 1, wherein said control system controls the common excitation unit so as to minimize a maximum value of differences between the electron-optic characteristics of the plurality of magnetic lenses and a target characteristic.

3. The apparatus according to claim 1, wherein said control system controls the common excitation unit and said plurality of electron-optic elements so as to make a focal position of each of the plurality of magnetic lenses coincide with a target position.

4. The apparatus according to claim 1, wherein each group is formed from a plural charged-particle beams.

5. The apparatus according to claim 4, wherein said control system controls the common excitation unit and said plurality of electron-optic elements every group so as to correct at least one of magnification and rotation of images each of which is formed on the substrate with the plural charged-particle beams of one group.

6. The apparatus according to claim 5, wherein each electron-optic element has a plurality of deflectors which deflect a plurality of charged-particle beams passing through said electron-optic element, and said control system individually controls the plurality of deflectors arranged for said electron-optic element, thereby correcting at least one of magnification and rotation of the image formed on the substrate.

7. The apparatus according to claim 5, wherein each electron-optic element has a plurality of incident position changing elements which change incident positions of a plurality of charged-particle beams passing through said electron-optic element on corresponding magnetic lenses, and said control system individually controls the plurality of incident position changing elements arranged for said electron-optic element, thereby correcting at least one of magnification and rotation of the image formed on the substrate.

8. A method of controlling an exposure apparatus which draws a pattern on a substrate with a plurality of charged-particle beams, wherein the exposure apparatus includes a charged-particle beam generation source which generates a plurality of charged-particle beams grouped into a plurality of groups each formed from at least one charged-particle beam, a magnetic lens array which is constituted by arraying a plurality of magnetic lenses corresponding to the plurality of groups between the charged-particle beam generation source and a substrate stage which supports the substrate, the plurality of magnetic lenses being excited by a common excitation unit, and a plurality of electron-optic elements which are arranged in correspondence with the plurality of groups and individually correct electron-optic characteristics of the plurality of magnetic lenses, the control method comprises the first step of adjusting the electron-optic characteristics of the plurality of magnetic lenses at once by controlling the common excitation unit, and the second step of individually correcting the electron-optic characteristics of the plurality of magnetic lenses by individually controlling the plurality of electron-optic elements, and an image formed on the substrate with the plurality of charged-particle beams grouped into the plurality of groups is optimized by the first and second steps.

9. A manufacturing method of manufacturing a device through a lithography step, wherein the lithography step includes the step of drawing a pattern on a substrate using the exposure apparatus defined in claim 1.

10. A manufacturing method of manufacturing a device through a lithography step, wherein the lithography step includes the step of drawing a pattern on a substrate using an exposure apparatus controlled by the control method defined in claim 8.

* * * * *

UNITED STATES PATENT AND TRADEMARK OFFICE
CERTIFICATE OF CORRECTION

PATENT NO. : 6,784,442 B2
DATED : August 31, 2004
INVENTOR(S) : Masato Muraki et al.

It is certified that error appears in the above-identified patent and that said Letters Patent is hereby corrected as shown below:

<u>Title page,</u>
Item [73], Assignee, "Canon Kabushiki Kaisha, Tokyo (JP)" should be changed to
-- Canon Kabushiki Kaisha, Tokyo (JP),
Hitachi, Ltd., Tokyo (JP),
ADVANTEST Corporation, Tokyo (JP). --.

Signed and Sealed this

Eighth Day of November, 2005

JON W. DUDAS
*Director of the United States Patent and Trademark Office*